United States Patent
Liu et al.

(10) Patent No.: US 11,384,421 B2
(45) Date of Patent: Jul. 12, 2022

(54) HIGH TEMPERATURE SPUTTERED STOICHIOMETRIC AMORPHOUS ALUMINUM OXIDE

(71) Applicant: The Government of the United States of America, as represented by the Secretary of the Navy, Arlington, VA (US)

(72) Inventors: Xiao Liu, Fairfax, VA (US); Battogtokh Jugdersuren, Alexandria, VA (US); Matthew R. Abernathy, Washington, DC (US); Thomas H. Metcalf, Washington, DC (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 16/275,556

(22) Filed: Feb. 14, 2019

(65) Prior Publication Data

US 2019/0284677 A1  Sep. 19, 2019

Related U.S. Application Data

(60) Provisional application No. 62/643,813, filed on Mar. 16, 2018.

(51) Int. Cl.
*C23C 14/00* (2006.01)
*H01L 39/24* (2006.01)
(Continued)

(52) U.S. Cl.
CPC ........ *C23C 14/0036* (2013.01); *C23C 14/081* (2013.01); *C23C 14/34* (2013.01); *G02B 5/08* (2013.01); *H01L 39/2493* (2013.01)

(58) Field of Classification Search
CPC ......... G02B 1/10; G02B 5/08; H01L 39/2493; C23C 14/0036; C23C 14/081; C23C 14/34; C23C 14/35
See application file for complete search history.

(56) References Cited

U.S. PATENT DOCUMENTS 9,530,535 B2   12/2016   Liu et al.
9,741,921 B2   8/2017   Liu et al.
(Continued)

FOREIGN PATENT DOCUMENTS

JP  04-160144       *  6/1992
JP  2000282231 A     10/2000
JP  2014189827 A     10/2014

OTHER PUBLICATIONS

Li et al. "Low-temperature magnetron sputter-deposition, hardness, and electrical resistivity of amorphous and crystalline alumina thin films", Journal of Vacuum Science & Technology A 18, pp. 2333-2338 (2000) (Year: 2000).*

(Continued)

*Primary Examiner* — Rodney G McDonald
(74) *Attorney, Agent, or Firm* — US Naval Research Laboratory; Joslyn J. Barritt

(57) ABSTRACT

A method for producing a sputtered stoichiometric a-$Al_2O_3$ thin film. A substrate is placed into a chamber containing an Al target to be sputtered. The chamber is evacuated to a base pressure of about $7 \times 10^{-8}$ Torr or lower and the temperature of the substrate is maintained. With a sputtering shutter in the chamber closed, Ar gas is flowed into the chamber to backsputter the Al target and Ar and $O_2$ gases are flowed into the chamber to presputter the target. The shutter is opened and Al is sputtered onto the substrate in the presence of the Ar and $O_2$ gases to obtain a sputtered a-$Al_2O_3$ film on the substrate.

8 Claims, 7 Drawing Sheets

(51) Int. Cl.
  *C23C 14/08* (2006.01)
  *C23C 14/34* (2006.01)
  *G02B 5/08* (2006.01)

(56) References Cited

U.S. PATENT DOCUMENTS

| | | |
|---|---|---|
| 2006/0042929 A1 | 3/2006 | Mauri |
| 2011/0042200 A1 | 2/2011 | Wilby |
| 2016/0032443 A1 | 2/2016 | Gu et al. |
| 2016/0090646 A1 | 3/2016 | Chen et al. |
| 2017/0365466 A1 | 12/2017 | Wang |

OTHER PUBLICATIONS

Wang et al. "Tribological and optical properties of crystalline and amorphous alumina thin films grown by low-temperature reactive magnetron sputter deposition", Surface and Coatings Technology 146-147 (2001) 189-194 (Year: 2001).*
Billard et al. "Interest of Pulsed and Modulated dc Discharges for Depositing Insulating Compounds by Reactive Magnetron Sputtering", Journal de Physique III, EDP Sciences, 1996, 6(9), pp. 1181-1187 (Year: 1996).*
Worhoff et al., "Optimization of Low-Less Al2O3 Waveguide Fabrication for Application in Active Integrated Optical Devices", ECS Trans. 3 17 pp. 17-26 (2006). (Year: 2006).*
Machine Translation 04-160144 (Year: 1992).*
Sridharan et al. "Pulsed DC magnetron sputtered Al2O3 films and their hardness", Surface & Coatings Technology 202 (2007) 920-924 (Year: 2007).*
Jameson et al. "Dielectric relaxation study of hydrogen exposure as a source of two-level systems in Al2O3", Journal of Non-Crystalline Solids, 357(2011) 2148-2151. (Year: 2011).*
Goldobin et al. "Strong coupling effects in (Nb—Al—AlOx)2-Nb stacked Josephson Junctions", Physical Review B, vol. 58, No. 22, 15078-15087, Dec. 1998. (Year: 1998).*
"Synthesis of Alumina Thin Films Using Reactive Magnetron Sputtering Method", Journal of Physics: Conf. Series 850 (2017) pp. 1-4. (Year: 2017).*
Search Report and Written Opinion dated May 28, 2019 in corresponding International Application PCT/2019/017954.
Matthias Steffen, "Superconducting qubits are getting serious," Physics 4, 103 (2011).
M. H. Devoret et al., "Superconducting Circuits for Quantum Information: An Outlook," Science, 339, 1169 (2013).
Jay M. Gambetta et al., "Building logical qubits in a superconducting quantum computing system," NPJ Quantum Information, 3, 2 (2017).

John M. Martinis et al., "Decoherence in Josephson Qubits from Dielectric Loss," Phys. Rev. Lett. 95, 210503 (2005).
R. O. Pohl et al., "Low temperature thermal conductivity and acoustic attenuation in amorphous solids," Rev. of Mod. Phys. 74, 991 (2002).
L. Gordon et al., "Hydrogen bonds in Al2O3 as dissipative two-level systems in superconducting qubits," Sci. Rep. 4, 7590 (2014).
S. J. Weber et al., "Single crystal silicon capacitors with low microwave loss in the single photon regime," Appl. Phys. Lett. 98, 172510 (2011).
D. R. Queen et al., "Excess specific heat in evaporated amorphous silicon," Phys. Rev. Lett. 110, 135901 (2013).
Xiao Liu et al., "Hydrogen free amorphous silicon with no tunneling states," Phys. Rev. Lett. 113, 025503 (2014).
D. Tielbürger, et al., "Thermally activated relaxation processes in vitreous silica: An investigation by Brillouin scattering at high pressures," Phys. Rev. B 45, 2750-2760 (1992).
Hanhee Paik et al., "Reducing quantum-regime dielectric loss of silicon nitride for superconducting quantum circuits," Appl. Phys. Lett. 96, 072505 (2010).
Hanhee Paik et al., "Observation of High Coherence in Josephson Junction Qubits Measured in a Three-Dimensional Circuit QED Architecture," Phys. Rev. Lett. 107, 240501 (2011).
Physics Today, Jul. 1997, p. 9.
Liu et al., "Hydrogen-Free Amorphous Silicon with No Tunneling States," Phys. Rev. Lett. 113, 025503 (2014).
Liu et al., "Comparing amorphous silicon prepared by electron-beam evaporation and sputtering toward eliminating atomic tunneling states," Journal of Alloys and Compounds 855 (2021) 157431.
Ludovic Berthier et al., "Facets of glass physics," Physics Today 69, 1, 40 (2016).
Ludovic Berthier et al., "Origin of Ultrastability in Vapor-Deposited Glasses," Phys. Rev. Lett, 119, 188002 (2017).
Hom-On, et al: "Influence of Substrate Temperature on Deposition Rate and Optical Properties of Aluminum Oxide Thin Films Prepared by Reactive DC Sputtering Technique," Key Engineering Materials, vol. 675-676, Jan. 25, 2016 (Jan. 25, 2016), pp. 281-284.
Berg et al: "Fundamental understanding and modeling of reactive sputtering processes," Thin Solid Films, Elsevier, Amsterdam, NL, vol. 476, No. 2, Apr. 8, 2005 (Apr. 8, 2005), pp. 215-230.
Mattox, "Chapter 6: Physical Sputtering and Sputter Deposition (Sputtering)", Jan. 1, 1998 (Jan. 1, 1998 ), Handbook of Physical Vapor Deposition (PVD) Processing:Film Formation, Adhesion, Surface Preparation and Contamination Control, Noyes Publ, Westwood, New Jersey, USA, pp. 343-405.
Extended European Search Report and Written Opinion dated Nov. 10, 2021 in corresponding European Application No. EP19766660.

* cited by examiner

HIGH TEMPERATURE SPUTTERED STOICHIOMETRIC AMORPHOUS ALUMINUM OXIDE

CROSS-REFERENCE

This Applications is a Nonprovisional of and claims the benefit of priority under 35 U.S.C. § 119 based on Provisional U.S. Patent Application No. 62/643,813 filed on Mar. 16, 2018. The Provisional Applications and all references cited herein are hereby incorporated by reference into the present disclosure in their entirety.

TECHNICAL FIELD

The present disclosure relates to aluminum oxide ($Al_2O_3$), particularly to sputtered stoichiometric amorphous aluminum oxide (a-$Al_2O_3$) suitable for superconducting quantum bit and high-precision optical cavity applications.

BACKGROUND

Quantum computing has been a rapidly developing research field in the past two decades. In the heart of quantum computing is the quantum bit, or "qubit." The qubit is a unit of quantum information, i.e., is the quantum analogue of the classical bit in currently available computer systems. Qubits in a quantum computer must be able to retain the quantum information they are given long enough to perform quantum logic operations across them.

In principle, any two-level quantum system can be used as a qubit, and a wide range of candidate quantum systems have been studied for their possible implementation as qubits in a practical quantum computer. For example, photons, electrons, or nuclear spins, trapped atoms or ions, and defect quantum states in solids can all be used as qubits for quantum computing.

Superconducting circuits with Josephson junctions, in which the superconductor is assembled macroscopically to form qubits, have emerged as a promising technology for quantum information processing with solid-state devices because of their scalability. See Matthias Steffen, "Superconducting qubits are getting serious," *Physics* 4, 103 (2011). Such qubits involve the use of nanofabricated superconducting electrodes coupled through Josephson junctions formed by connecting two superconducting electrodes separated by a dielectric insulating layer.

Currently, the main issues that limit the use and performance of such superconducting circuits as qubits are decoherence and dephase caused by spurious coupling of such qubits to microscopic defect states in the materials that are used to fabricate the circuits. Because such qubits involve the collective motion of a large number (~$10^{10}$) of Cooper-pair electrons, their coherence time is typically very short, often on the order of 1 ns. While progress has been made to increase the coherence time, so far, the progress has been limited and quantum decoherence time $T_1$ and dephase time $T_2$ have been remained around 100 μs for many years. See Steffen, supra; see also M. H. Devoret et al., "Superconducting Circuits for Quantum Information: An Outlook," *Science*, 339, 1169 (2013); Jay M. Gambetta et al., "Building logical qubits in a superconducting quantum computing system," *NPJ Quantum Information*, 3, 2 (2017).

It is now understood that dielectric loss from two-level tunneling systems (TLS) in the dielectric insulating layer is the dominant source for decoherence in superconducting qubits. See John M. Martinis et al., "Decoherence in Josephson Qubits from Dielectric Loss," *Phys. Rev. Lett.* 95, 210503 (2005). TLS universally exist in almost all kinds of amorphous solids and a large number of disordered crystalline solids. See R. O. Pohl et al., "Low temperature thermal conductivity and acoustic attenuation in amorphous solids," *Rev. of Mod. Phys.* 74, 991 (2002).

The most commonly used dielectric thin film in superconducting qubits is amorphous aluminum oxide (a-$Al_2O_3$), also known as "amorphous alumina," either deposited or oxidized on the surface of deposited aluminum thin films. Amorphous alumina films are often used as optical coating materials due to their low optical absorption and relative resistance to physical and chemical damage. As a result, a-$Al_2O_3$ has been considered as a possible material for use in producing the mirror coatings used in high-precision optical cavity applications such as gravitational wave detectors.

These instruments are composed of a number of large substrates that serve as test masses for probing gravitational waves, with the substrates being coated with alternating layers of ultra-low optical absorption thin films in order to make a highly-reflective surface. The surfaces of these substrates/test masses then serve as mirrors for use in a km-scale interferometer, which is able to determine the distances between test masses with a precision of better than $10^{-22}$ meters.

The requirements for these coatings are primarily optical, in that the materials must have low optical absorption, but they also require a low level of mechanical loss. Mechanical loss, also called internal friction, in the coatings gives rise to thermal motion on the surface of the mirrors, known as Brownian thermal noise, which is large enough to mask signals from gravitational waves. TLS in the coatings are one of the main sources of mechanical loss at low temperatures.

Just like most other amorphous solids, a-$Al_2O_3$ films contain TLS. Efforts have been made to understand the loss mechanisms in order to reduce the loss, e.g., by replacing with other dielectric thin films or crystalline $Al_2O_3$. See L. Gordon et al., "Hydrogen bonds in $Al_2O_3$ as dissipative two-level systems in superconducting qubits," *Sci. Rep.* 4, 7590 (2014); see also S. J. Weber et al., "Single crystal silicon capacitors with low microwave loss in the single photon regime," *Appl. Phys. Lett.* 98, 172510 (2011). The inventors of the present invention have previously proposed amorphous silicon (a-Si), see U.S. Pat. No. 9,530,535, and amorphous germanium (a-Ge), see U.S. Pat. No. 9,741,921, deposited at high substrate temperatures as an alternative low loss dielectric layer for superconducting qubit applications. In other cases, hydrogenated silicon nitride has been used to replace a-$Al_2O_3$ or silicon dioxide as a dielectric layer in order to reduce dielectric loss. See Hanhee Paik et al., "Reducing quantum-regime dielectric loss of silicon nitride for superconducting quantum circuits," *Appl. Phys. Lett.* 96, 072505 (2010).

Efforts have also been made to make overall device size larger while keeping the dielectric layer thickness as small as possible to reduce the impact of the TLS in the dielectric. See Hanhee Paik et al., "Observation of High Coherence in Josephson Junction Qubits Measured in a Three-Dimensional Circuit QED Architecture," *Phys. Rev. Lett.* 107, 240501 (2011). Doing so has achieved the record long coherence time of 60 μs at the time.

Using completely crystalline silicon as a dielectric layer has also being pursued; however, because of the presence of surface defect states which can become a source of dielectric loss, use of such materials has had only limited success in reducing the incidence of TLS in the dielectric layer. See S. J. Weber et al., "Single crystal silicon capacitors with low microwave loss in the single photon regime," *Appl. Phys. Lett.* 98, 172510 (2011)); S. E. de Graaf et al., "Suppression of low-frequency charge noise in superconducting resonators by surface spin desorption," *Nature Communication*, 9, 1143 (2018).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

In accordance with the present invention, a sputtered stoichiometric a-$Al_2O_3$ thin film can be obtained by sputtering Al onto a substrate in the presence of an $O_2$ gas flow under a controlled DC power and gas pressure. The films can be deposited using a magnetron sputtering system with the chamber pressure controlled at 2-15 mTorr. Other systems and other pressures can be used as appropriate, but in general, lower chamber pressures are preferred in order to enable the growth of denser films.

The process in accordance with the present invention begins with placing a substrate into a sputtering chamber containing Al material (often referred to as the "target") to be sputtered onto the substrate. It is best to use a pure (5N) aluminum target with DC sputtering, though an $Al_2O_3$ target with RF sputtering can also be used. The substrate can be single crystal silicon, fused silica, sapphire, or on a superconducting thin film as in a Josephson junction for qubits. The substrate temperature is controlled in the chamber, and can be maintained at temperatures ranging from room temperature (about 20° C.) up to about 800° C.

Once the substrate is placed in the chamber, the sputtering chamber is evacuated to a base pressure of about $7 \times 10^{-8}$ Torr or lower to minimize impurities in the chamber.

Once the chamber is evacuated, backsputtering is performed by flowing argon (Ar) gas into the chamber for a predetermined time under DC power and a predetermined gas pressure in order to clean the target. In an exemplary embodiment, the backsputtering is accomplished by flowing Ar gas into the chamber for 3 minutes under a DC power of 10 W, an Ar flow of 25 sccm, and a gas pressure of 20 mTorr.

Following this backsputtering step, the target is presputtered by flowing argon (Ar) and oxygen ($O_2$) gas in the chamber at a predetermined ratio and flow rate, predetermined pressure, and predetermined power for a predetermined period of time in order to clean the target surface. The presputtering is done under the same chamber conditions as used for the sputtering step but without the shutter being opened, so that no deposition on the substrate occurs during presputtering. In an exemplary case, the target is presputtered in Ar and $O_2$ gas flows at 45 and 10 sccm, respectively, under a pressure of 3 mTorr and a DC power of 200 W for 5 minutes.

In a next step in accordance with the present invention, the sputtering shutter in the chamber is opened. The a-$Al_2O_3$ films are then sputtered onto the substrate by continuing the deposition of the Al onto the substrate in the presence of Ar and $O_2$ gas flows under the same conditions as were used in the presputtering step. In an exemplary embodiment, the Ar and $O_2$ flow rate is kept at 45 and 10 sccm, respectively, the gas pressure is kept at 3 mTorr, and the DC power is kept at 50-200 W to produce an a-$Al_2O_3$ film on the substrate, with deposition continuing until a film having a predetermined thickness is obtained. The deposition rate will typically be in the range of 0.1 to 1 nm/s but can vary depending on the exact deposition parameters employed.

DETAILED DESCRIPTION

Figure 1:
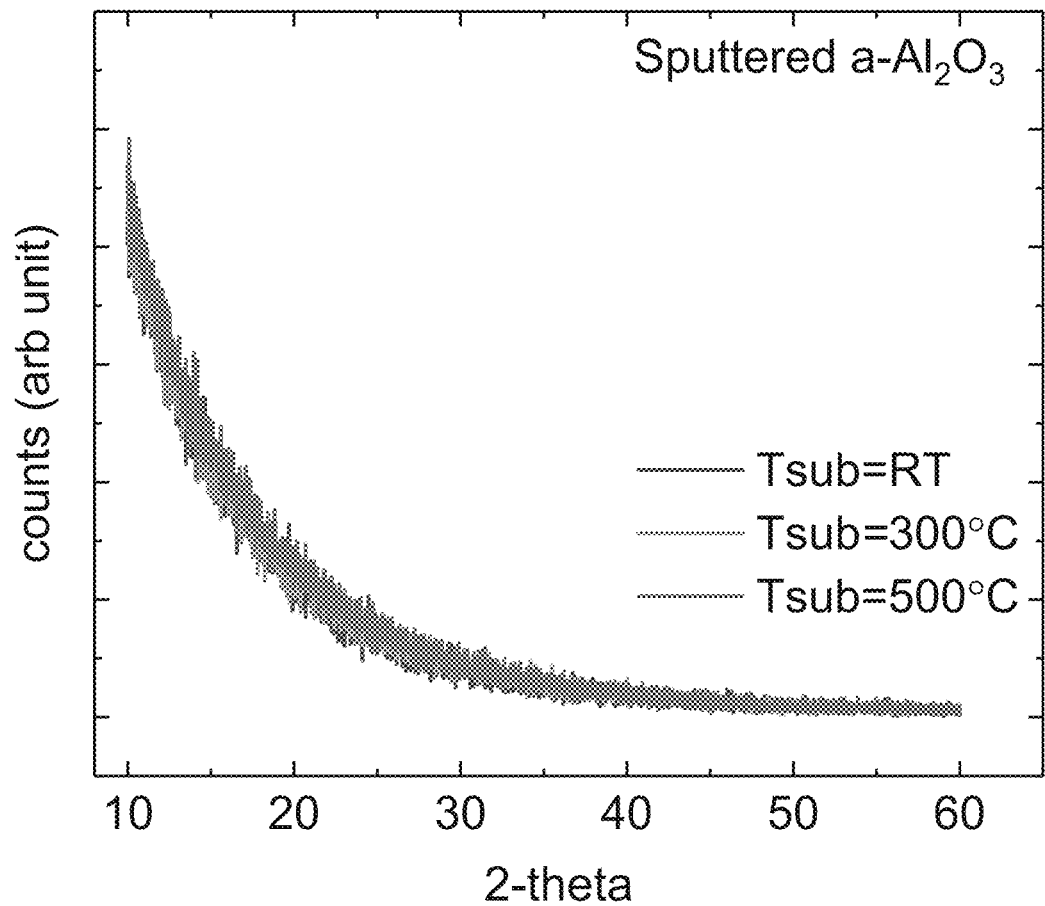
FIG. 1 shows the grazing incidence X-ray diffraction (XRD) pattern of a-$Al_2O_3$ thin films deposited at room temperature, 300° C., and 500° C.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present disclosure relates to aluminum oxide ($Al_2O_3$), particularly to sputtered stoichiometric amorphous aluminum oxide suitable for use as a superconducting quantum bit and in high-precision optical cavity applications.

The inventors' current work on high-temperature sputtered a-$Al_2O_3$ thin films is inspired by their previous research on a-Si and a-Ge prepared by e-beam evaporation with high substrate temperatures. See '535 and '921 patents, supra; see also D. R. Queen et al., "Excess specific heat in evaporated amorphous silicon," *Phys. Rev. Lett.* 110, 135901 (2013); and Xiao Liu et al., "Hydrogen free amorphous silicon with no tunneling states," *Phys. Rev. Lett.* 113, 025503 (2014). However, a-Si and a-Ge may be reactive when they are deposited to certain metallic surfaces, and limit their range of applications.

Internal friction measurements have shown that TLS density in such a-Si and a-Ge films has been greatly reduced, especially in a-Si. See '535 patent, supra; see also Liu, supra. We also found that the elastic loss, or internal friction, of a-Si is about three orders of magnitude smaller than that of a typical amorphous thin film. Although sputtered a-$Al_2O_3$ only accomplishes a reduction of a factor of 5, this material is far more useful than either a-Si or a-Ge as a dielectric layer or as an optical coating.

It may be expected that further improvements can be achieved by fine adjustment of sputtering parameters, including substrate temperature during deposition to as high as possible as long as the film stay in amorphous state. In addition, it is expected that similar deposition techniques, such as ion-beam assisted sputtering, electron beam evaporation may also yield similar high quality a-$Al_2O_3$ thin films as observed in this work.

We recently found that stoichiometric a-$Al_2O_3$ sputtered at high substrate temperature (500° C.) during growth can reduce the mechanical loss by a factor of 5. This is particularly attractive for superconducting qubit applications, as it is the most commonly used material for this purpose. By sputtering a-$Al_2O_3$ in accordance with the process of the present invention, both quantum decoherence time $T_1$ and dephase time $T_2$ can be increased significantly.

In accordance with the present invention, a sputtered stoichiometric a-$Al_2O_3$ thin film can be obtained by sputtering Al onto a substrate in the presence of an $O_2$ gas flow under a controlled DC power and gas pressure. The films can be deposited using a magnetron sputtering system with the chamber pressure controlled at 2-15 mTorr. Other sputtering systems and other pressures can be used as appropriate, but in general, lower chamber pressures are preferred in order to enable the growth of denser films.

The process in accordance with the present invention begins with placing a substrate into a sputtering chamber containing aluminum (Al) material (often referred to as the "target") to be sputtered onto the substrate. It is best to use a pure (5N) aluminum target with DC sputtering, though an $Al_2O_3$ target with RF sputtering can also be used. The substrate can be single crystal silicon, fused silica, sapphire, or on a superconducting thin film as in a Josephson junction for qubits. The substrate temperature is controlled in the chamber, and can be maintained at temperatures ranging from room temperature (about 20° C.) up to about 800° C.

Once the substrate is placed in the chamber, the sputtering chamber is evacuated to a base pressure of about $7 \times 10^{-8}$ Torr or lower to minimize impurities in the chamber.

Once the chamber is evacuated, backsputtering is performed by flowing argon (Ar) gas into the chamber for a predetermined time under DC power and a predetermined gas pressure in order to clean the target. In an exemplary embodiment, the backsputtering is accomplished by flowing Ar gas into the chamber for 3 minutes under a DC power of 10 W, an Ar flow of 25 sccm, and a gas pressure of 20 mTorr.

Following this backsputtering step, the target is presputtered by flowing argon (Ar) and oxygen ($O_2$) gas in the chamber at a predetermined ratio and flow rate, predetermined pressure, and predetermined power for a predetermined period of time in order to further clean the target in the sputtering chamber. The presputtering is done under the same chamber conditions as used for the sputtering step but without the shutter being opened, so that no deposition on the substrate occurs during presputtering. In an exemplary case, the target is presputtered in Ar and $O_2$ gas flows at 45 and 10 sccm, respectively, under a pressure of 3 mTorr and a DC power of 200 W for 5 minutes.

Following the presputtering, in a next step in accordance with the present invention, the shutter in the chamber is opened. The a-$Al_2O_3$ films are then sputtered onto the substrate by continuing the deposition of the Al onto the substrate in the presence of Ar and $O_2$ gas flows under the same conditions as were used in the presputtering step. In an exemplary embodiment, the Ar and $O_2$ flow rate is kept at 45 and 10 sccm, respectively, the gas pressure is kept at 3 mTorr, and the DC power is kept at 50-200 W to produce an a-$Al_2O_3$ film on the substrate, with deposition continuing until a film having a predetermined thickness is obtained. The deposition rate will typically be in the range of 0.1 to 1 nm/s but can vary depending on the exact deposition parameters employed.

EXAMPLES

Thin films a-$Al_2O_3$ were sputtered in an AJA magnetron sputtering system. For internal friction measurements, the films were deposited on the neck of a double-paddle oscillator (DPO) substrate made out of 300 μm thick (100) oriented single crystal silicon wafer. For each deposition on a DPO, films were also sputtered on two additional substrates, one silicon (the same as the DPO) and one sapphire for structural characterization and thickness measurements.

The sputtering details for the three a-$Al_2O_3$ films are described below.

Example 1: A-$Al_2O_3$ Film Sputtering at Room Temperature (RT) on a DPO

The substrate was placed in the sputtering chamber containing an Al target. The substrate for this Example was not heated but remained at room temperature. The chamber was then evacuated to a base chamber pressure of $7 \times 10^{-8}$ Torr.

The deposition process started with a backsputtering step to clean contaminants from the target, with the backsputtering being performed for 3 minutes under a DC power of 10 W and in an Ar flow of 25 sccm under a gas pressure of 20 mTorr.

Following this backsputtering step, the target was presputtered in the chamber for 5 minutes without the shutter being opened so that no deposition on the substrate occurred, with the presputtering being done at a DC power of 200 W and with Ar and $O_2$ flows of 45 and 10 sccm, respectively, under a gas pressure of 3 mTorr.

The shutter was then opened to enable deposition of the a-$Al_2O_3$ film on the target, with the same pressure, power, and flows as in the presputtering step being maintained. The shutter was left open for 6 hours, resulting in a sputtered a-$Al_2O_3$ film having a thickness of 320 nm, corresponding to a deposition rate of 0.88 nm/min.

Example 2: A-$Al_2O_3$ Film Sputtering at 300° C. on a DPO

The substrate was placed in the sputtering chamber containing an Al target. The chamber was evacuated to a base chamber pressure of $7 \times 10^{-8}$ Torr. The substrate for this Example was then heated to a temperature of 300° C. and maintained at that temperature.

As with the previous Example, the deposition process started with a backsputtering step to clean contaminants from the target, with the backsputtering being performed for 3 minutes under a DC power of 10 W and in an Ar flow of 25 sccm under a gas pressure of 20 mTorr.

Following this backsputtering step, presputtering was performed in the chamber for 5 minutes without the shutter being opened so that no deposition on the target occurred, with the presputtering being done at a DC power of 200 W and with Ar and $O_2$ flows of 45 and 10 sccm, respectively, under a gas pressure of 3 mTorr.

The shutter was then opened to enable deposition of the a-$Al_2O_3$ film on the target, with the same pressure, power, and flows as in the presputtering step being maintained. The shutter was left open for 6 hours, resulting in a sputtered a-Al$_2$O$_3$ film having a thickness of 165 nm, corresponding to a deposition rate of 0.46 nm/min.

Example 3: A-Al$_2$O$_3$ Film Sputtering at 500° C. on a DPO

The substrate was placed in the sputtering chamber containing an Al target. The chamber was evacuated to a base chamber pressure of 7×10$^{-8}$ Torr. The substrate for this Example was then heated to a temperature of 500° C. and maintained at that temperature.

As with the previous Examples, the deposition process started with a backsputtering step to clean contaminants from the target, with the backsputtering being performed for 3 minutes under a DC power of 10 W and in an Ar flow of 25 sccm under a gas pressure of 20 mTorr.

Following this backsputtering step, presputtering was performed in the chamber for 5 minutes without the shutter being opened so that no deposition on the target occurred, with the presputtering being done at a DC power of 200 W and with Ar and O$_2$ flows of 45 and 10 sccm, respectively, under a gas pressure of 3 mTorr.

The shutter was then opened to enable deposition of the a-Al$_2$O$_3$ film on the target, with the same pressure, power, and flows as in the presputtering step being maintained. The shutter was left open for 6 hours, resulting in a sputtered a-Al$_2$O$_3$ film having a thickness of 114 nm, corresponding to a deposition rate of 0.32 nm/min.

FIG. 1 shows the grazing incidence X-ray diffraction (XRD) pattern of a-Al$_2$O$_3$ thin films deposited at three substrate temperatures: room temperature (Example 1), 300° C. (Example 2), and 500° C. (Example 3). All of the films are amorphous, and, as can be seen from the plot in FIG. 1, no indication of crystallinity, which shows a peak at a 2θ angle of 52.6° (JCPDS, ICDD No. 81-2267), can be distinguished. We also performed Raman spectroscopy on these three samples. As expected for amorphous a-Al$_2$O$_3$, Raman spectra is featureless, which confirms that all three films are amorphous.

Figure 2A:
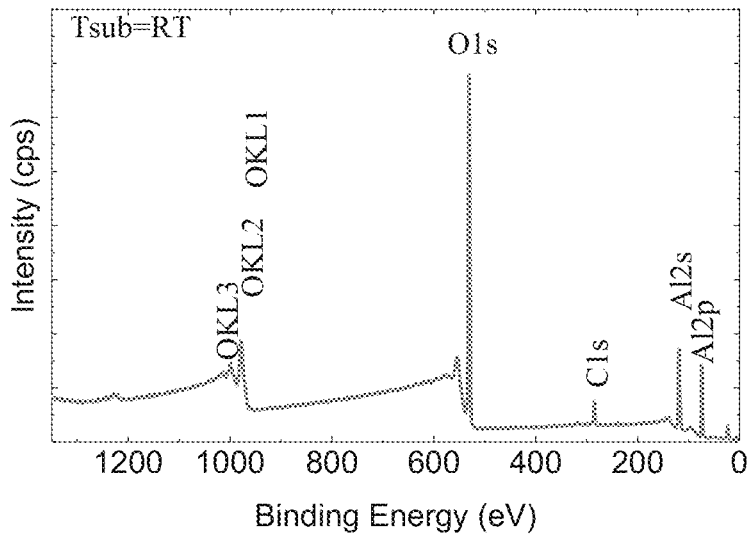
FIGS. 2A-2C show the X-ray photoelectron spectroscopy (XPS) survey spectrum of the a-$Al_2O_3$ thin films deposited at room temperature that were also examined for FIG. 1.
Figure 2B:
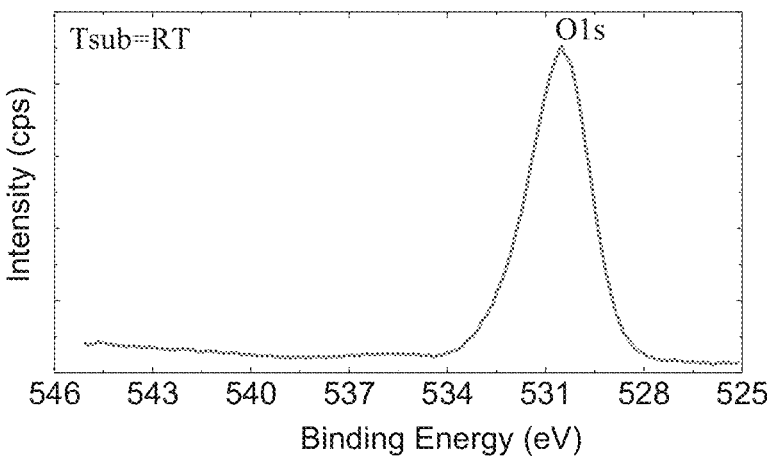
Figure 2C:
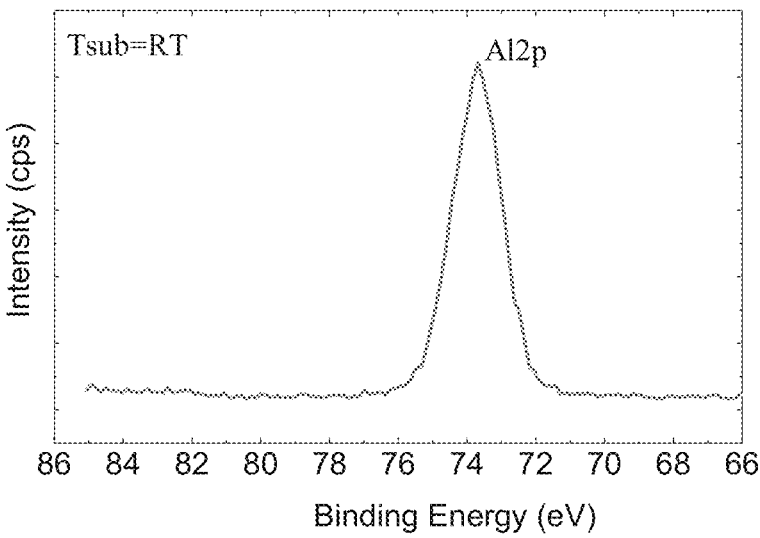
Figure 3A:
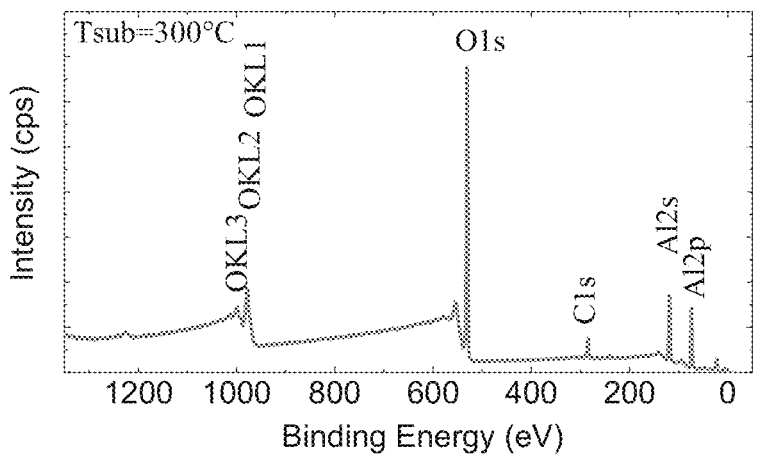
FIGS. 3A-3C show the X-ray photoelectron spectroscopy (XPS) survey spectrum of the a-$Al_2O_3$ thin films deposited at 300° C. that were also examined for FIG. 1.
Figure 3B:
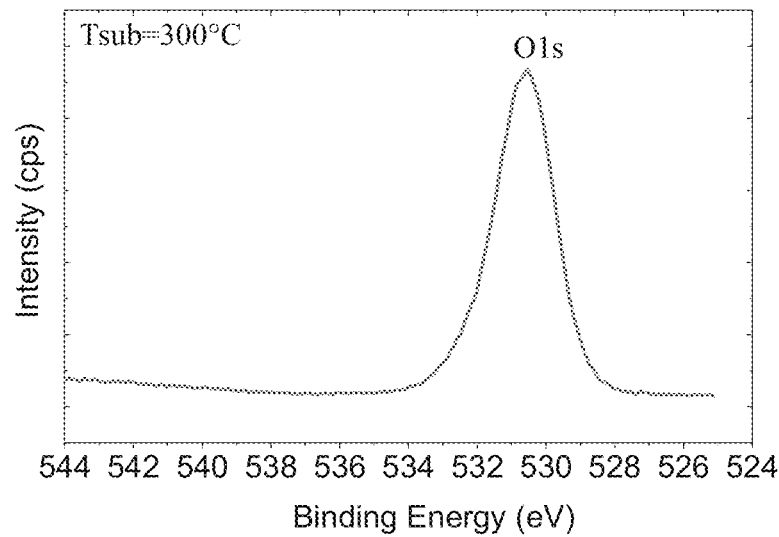
Figure 3C:
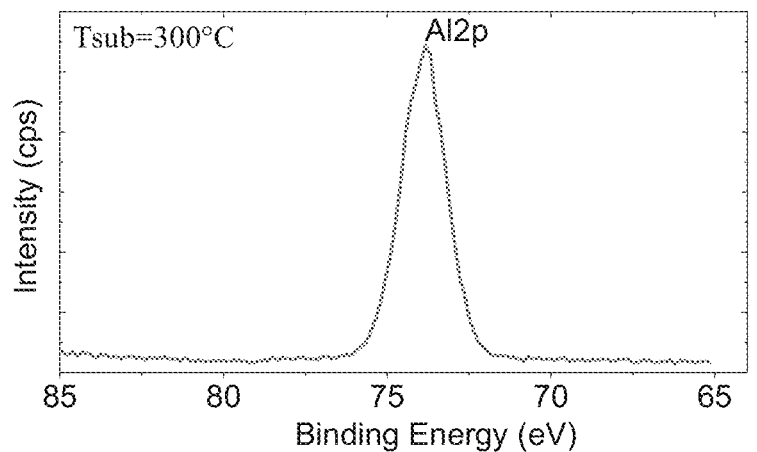
Figure 4A:
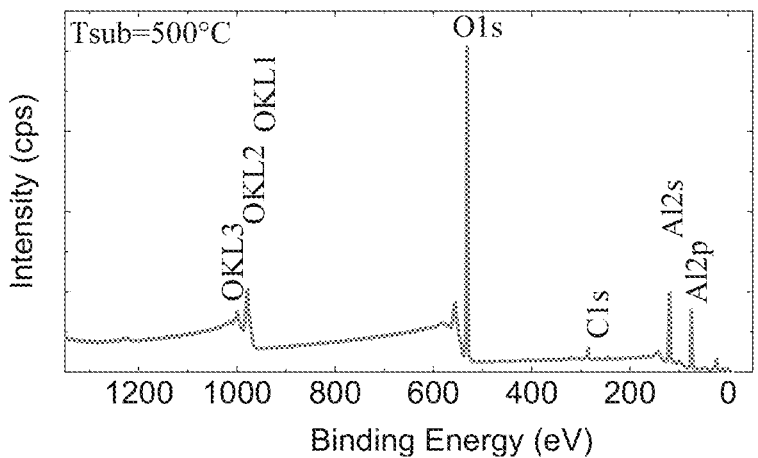
FIGS. 4A-4C show the X-ray photoelectron spectroscopy (XPS) survey spectrum of the a-$Al_2O_3$ thin films deposited at 500° C. that were also examined for FIG. 1.
Figure 4B:
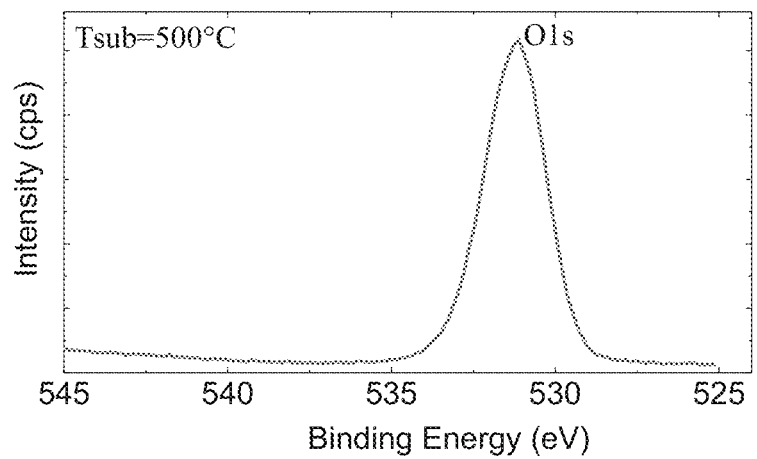
Figure 4C:
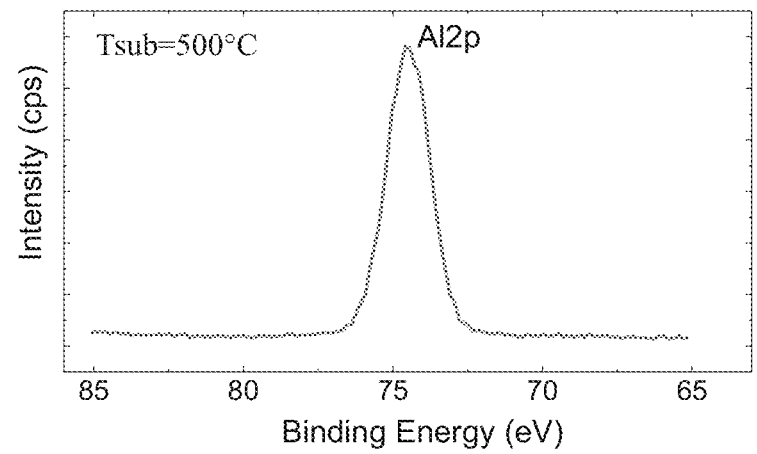

FIGS. 2A-2C, 3A-3C, and 4A-4C, respectively show the X-ray photoelectron spectroscopy (XPS) survey spectrum of the same three a-Al$_2$O$_3$ thin films that were examined to obtain the plot shown in FIG. 1, with FIGS. 2A-2C showing the spectrum for films deposited at room temperature, FIGS. 3A-3C showing the spectrum for films deposited at 300° C., and FIGS. 4A-4C showing the spectrum for films deposited at 500° C. For all three films shown in these figures, the position of the Al 2p peak at 74 eV is the result of Al present in the experimental surface region bound as Al$_2$O$_3$. The corresponding O 1s is observed approximately at 531.9 eV, whose location indicates that the oxygen is in a bound state as expected. The O/Al ratio is found to be 1.48, 1.43, and 1.46 for films sputtered at room temperature, 300° C. and 500° C., respectively. For perfectly stoichiometric a-Al$_2$O$_3$, we expect this ratio to be 1.50; considering the accuracy and precision issues with XPS, these films are considered perfectly stoichiometric. The only other notable characteristics seen are some small carbon and argon peaks in the survey plots. The carbon is surface contamination, which is to be expected since the samples were not cleaned before measuring. The argon was probably implanted during the deposition process, but in all cases, they are less than 2%, and can be regarded as inconsequential.

Figure 5:
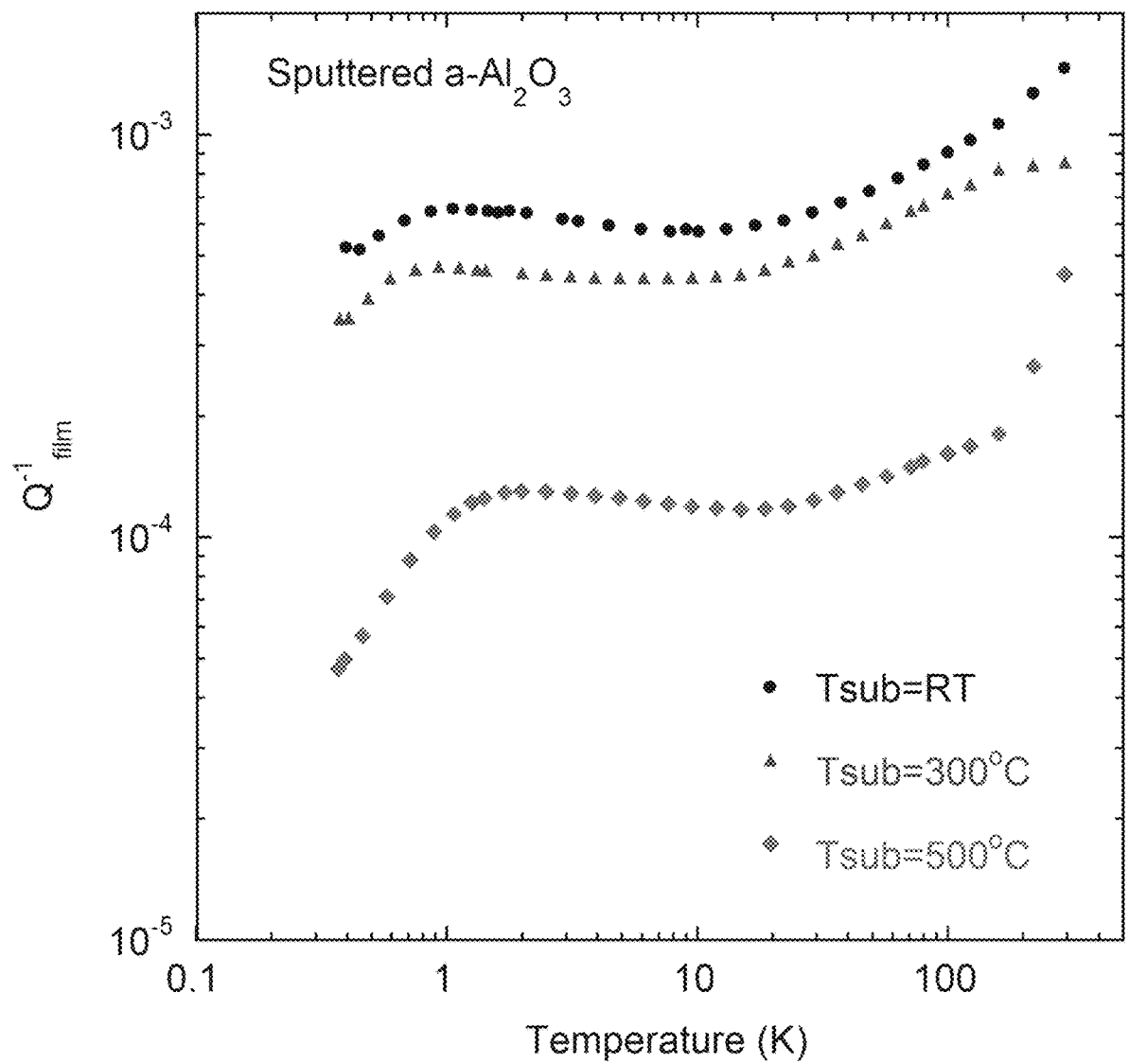
FIG. 5 shows the results of internal friction measurements of the three a-$Al_2O_3$ films examined for FIG. 1.

Internal friction of the three a-Al$_2$O$_3$ films are shown in FIG. 5. TLS cause elastic dissipation at low temperatures and contribute a temperature independent plateau at a few degree Kelvin. For a-Al$_2$O$_3$, the plateau range is from 2 to 20 K. TLS exist universally in almost all amorphous solids, see Pohl et al., supra, and it is hard to make them disappear. The "glassy range" has been the bottleneck that limits the coherence time of superconducting qubits. It also contributes to the thermal noise in the mirror coatings of gravitational wave detectors. The internal friction of a-Al$_2$O$_3$ decreases as the substrate temperature increases by a factor of five. Except for the effect observed in a-Si where much larger change has been observed, this is quite a significant reduction. In particular, a-Al$_2$O$_3$ is the most commonly used dielectric layer in superconducting qubits. Typical thermal treatment will result in a reduction of TLS by less than a factor of two.

Figure 6:
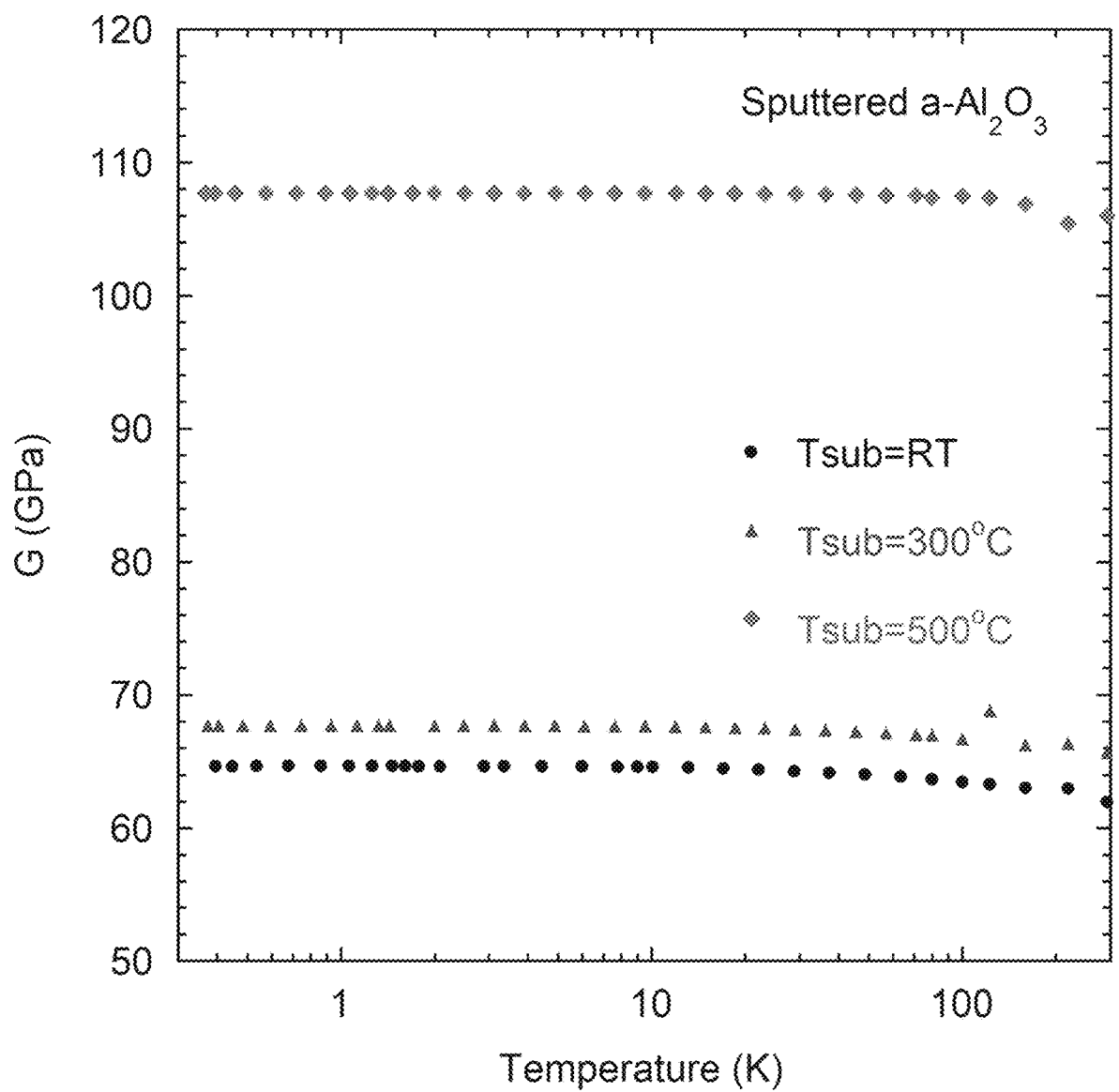
FIG. 6 shows the temperature-dependent shear modulus of a-$Al_2O_3$ films.
Figure 7:
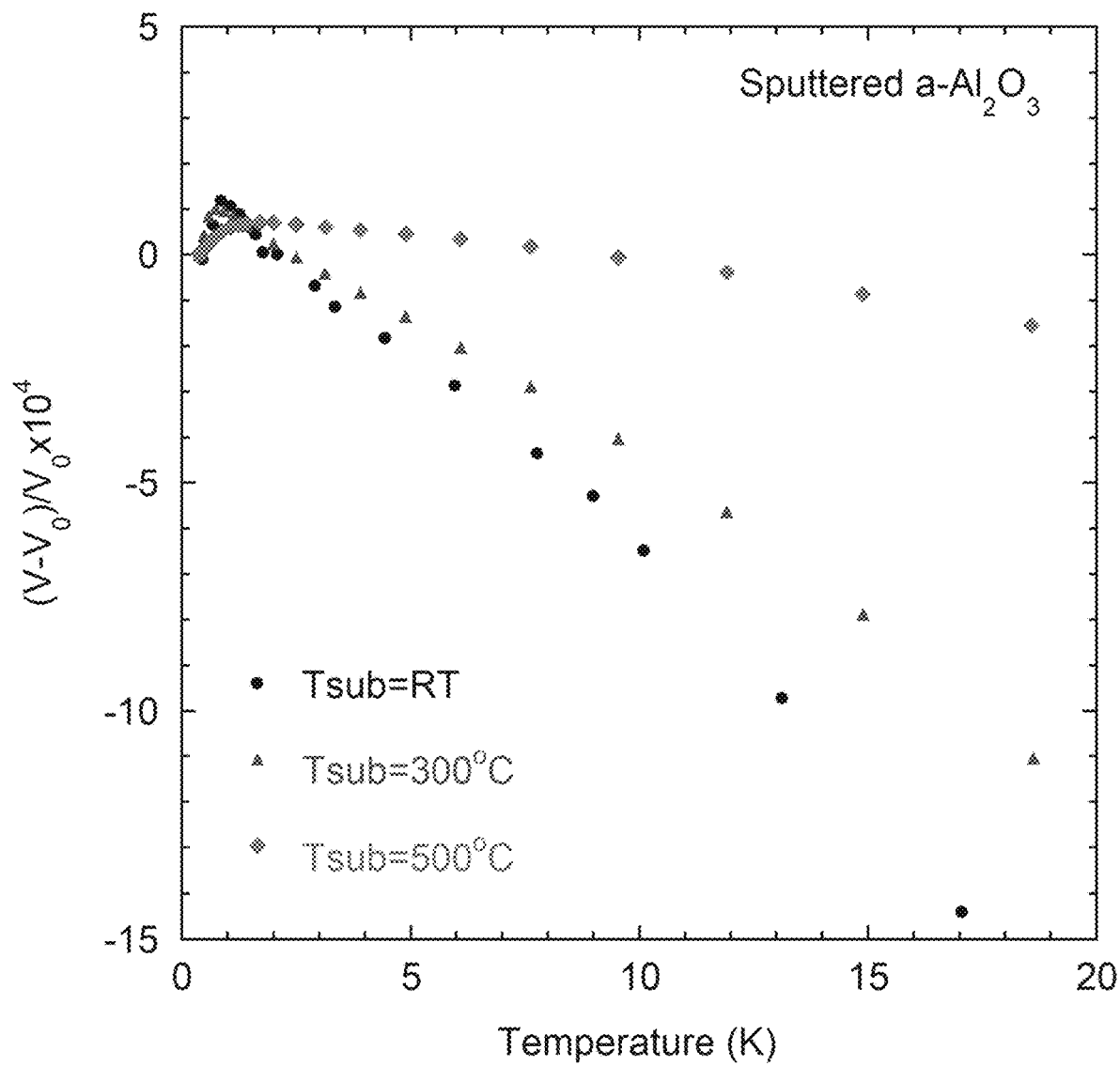
FIG. 7 shows the relative change of speed of sound of those films shown in FIGS. 5 and 6.

FIG. 6 shows the temperature-dependent shear modulus of a-Al$_2$O$_3$ films. We can observe a rapid structural change representing improvement in structure order with increasing substrate temperature. FIG. 7 shows the relative change of speed of sound of the films shown in FIGS. 5 and 6. Accompanied with the internal friction plateau, amorphous solids also show a linear T-dependent relative change of speed of sound with a negative slope β at a few degree Kelvin. β is proportional to the internal friction plateau. This can be understood as the thermally activated relaxation rate dominates the quantum tunneling rate of the same TLS at higher temperatures. See D. Tielbirger, et al., "Thermally activated relaxation processes in vitreous silica: An investigation by Brillouin scattering at high pressures," *Phys. Rev. B* 45, 2750-2760 (1992). As the substrate temperature increases, β decreases in agreement with the internal friction measurements.

Although the reduction of TLS density is smaller than we previously observed in a-Si, we believe further optimization can lead to more reduction. In addition, we emphasize that a-Al$_2$O$_3$ is a far more practical and useful material for superconducting quantum computer and high precision optical cavity applications. It is chemically stable and would not react with superconducting metal contacts. It is also transparent (low loss) in visible light frequency range for optical purposes.

Although we have not build such a qubit ourselves, our research results clearly show that this material has lower TLS density than the material that is used today. We want to emphasize that the material developed in this work is the material that is widely used in superconducting qubits community. We find a new recipe to reduce the TLS density. This is different from our previous findings in a-Si and a-Ge. Although a-Si and a-Ge have lower elastic losses, they are easy to react with metals and may have other unwanted defects such as dangling bonds. Also, both of them are not transparent in visible light range for optical applications.

Advantages and New Features

The new thin film a-Al$_2$O$_3$ material sputtered at high growth temperature of 500° C. discussed here has a factor of five lower TLS density than its room temperature. Thus it will significantly increase the quantum coherence time of qubits once implemented and reduce thermal noise in optical coatings used in high-precision optical cavity applications. Scientifically, the demonstration of a reduction of TLS density in an oxide coating material for the first time may imply that similar recipes involving high substrate temperature may result in similar reduction of TLS density in other oxide materials, including a-SiO$_2$ and a-Ta$_2$O$_5$.

Amorphous aluminum oxide films have previously been rejected for use in gravitational wave detectors due to having a high level of internal friction. Our substantial reduction in the internal friction of these films opens them up for use in future gravitational wave detectors, as well as other high-precision optical cavity applications.

Alternatives

As we have discussed before, there are many parallel researches and developments to build reliable qubits to make a successful and reliable quantum computer possible. Superconducting qubits is one of the most promising approach for its complete electronic access and up-scalability. Significant efforts have been made to minimize the effects of dielectric loss by TLS. Our new thin film material can be combined with other technologies to further reduce the dielectric losses and hence increase the quantum coherence time of qubits.

There are also efforts to get rid of the amorphous dielectric thin films all together. However, these efforts create other problems. First, to use crystalline thin films involves much more complicated deposition process and higher temperature. Second, to use single crystalline dielectric substrate as dielectric media would make qubit structure much larger and surface losses will become a problem as well.

Similar thoughts to get rid of amorphous dielectric coatings exist in high-precision optical cavity applications, in particular, gravitational wave detectors. However, to deposit single crystalline mirror coatings for gravitational wave detectors, one would need a huge deposition system that does not currently exist and would be astronomically expensive. Polycrystalline thin films would not work well due to its grain boundary scattering of light. To develop low loss dielectric thin films is a path that cannot be avoided.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for producing a fully amorphous sputtered stoichiometric aluminum oxide ($Al_2O_3$) thin film having no crystallinity and having a reduced density of two-level tunneling systems (TLS) for a superconducting quantum circuit, comprising:
   placing a substrate into a sputtering chamber having an Al-containing target therein and evacuating the chamber to a predetermined base pressure of no more than $7\times10^{-8}$ Torr;
   controlling the substrate temperature in the chamber to maintain the substrate at room temperature;
   while a sputtering shutter in the chamber is closed, flowing argon (Ar) gas into the chamber at a flow rate of 25 sccm under a first predetermined controlled gas pressure of 20 mTorr and applying a first predetermined DC power of 10 W to backsputter the Al-containing target in the chamber;
   while the sputtering shutter in the chamber is still closed, flowing Ar and oxygen ($O_2$) gases into the chamber at a predetermined Ar:$O_2$ flow rate ratio of 4.5:1 under a second controlled gas pressure of 3 mTorr and applying a second predetermined DC power of 200 W to pre-sputter the Al-containing target in the chamber for 5 minutes; and
   opening the sputtering shutter and sputtering Al from the target onto the substrate while continuing to flow the Ar and $O_2$ gases into the chamber at the predetermined Ar:$O_2$ flow rate ratio of 4.5:1 under the second predetermined gas pressure of 3 mTorr and the second predetermined DC power of 200 W;
   wherein the sputtering of the Al and the flowing of the Ar and $O_2$ gases at the predetermined Ar:$O_2$ flow rate ratio of 4.5:1 under the second predetermined gas pressure of 3 mTorr and the second predetermined DC power of 200 W causes an amorphous $Al_2O_3$ film having no crystallinity to be deposited on the substrate at a rate of 0.88 nm/min, the deposited $Al_2O_3$ film being fully stoichiometric and having a predetermined reduced density of TLS.

2. The method for producing a fully amorphous sputtered stoichiometric $Al_2O_3$ thin film according to claim 1, wherein the chamber is evacuated to a base chamber pressure of about $7\times10^{-8}$ Torr.

3. A method for making a superconducting $Al_2O_3$ quantum bit having a reduced density of two-level tunneling states (TLS), comprising:
   placing a substrate comprising a first superconducting thin film material into a sputtering chamber having an Al-containing target therein and evacuating the chamber to a predetermined base pressure of no more than $7\times10^{-8}$ Torr;
   controlling the substrate temperature in the chamber to maintain the substrate at room temperature;
   while a sputtering shutter in the chamber is closed, flowing argon (Ar) gas into the chamber at a flow rate of 25 sccm under a first predetermined controlled gas pressure of 20 mTorr and applying a first predetermined DC power of 10 W to backsputter the Al-containing target in the chamber;
   while the sputtering shutter in the chamber is still closed, flowing Ar and oxygen ($O_2$) gases into the chamber at a predetermined Ar:$O_2$ flow rate ratio of 4.5:1 under a second controlled gas pressure of 3 mTorr and applying a second predetermined DC power of 200 W to pre-sputter the Al-containing target in the chamber for 5 minutes; and
   opening the sputtering shutter and sputtering Al from the target onto the substrate while continuing to flow the Ar and $O_2$ gases into the chamber at the predetermined Ar:$O_2$ flow rate ratio of 4.5:1 under the second predetermined gas pressure of 3 mTorr and the second predetermined DC power of 200 W;
   wherein the substrate temperature, the sputtering of the Al and the flowing of the Ar and $O_2$ gases at the predetermined Ar:$O_2$ flow rate ratio of 4.5:1 under the second predetermined gas pressure of 3 mTorr and the second predetermined DC power of 200 W causes an amorphous $Al_2O_3$ film having no crystallinity to be deposited on the substrate at a rate of 0.88 nm/min, the deposited $Al_2O_3$ film being fully stoichiometric and having a density of TLS that is reduced by a factor of five; and
   depositing a second superconducting thin film material on an upper surface of the $Al_2O_3$ film to form a superconducting quantum bit structure.

4. The method according to claim 3, wherein the superconducting quantum bit is a Josephson junction.

5. A method for producing a fully amorphous sputtered stoichiometric aluminum oxide ($Al_2O_3$) thin film having no crystallinity and having a reduced density of two-level tunneling systems (TLS) for a superconducting quantum circuit, comprising:

placing a substrate into a sputtering chamber having an Al-containing target therein and evacuating the chamber to a predetermined base pressure of no more than $7\times10^{-8}$ Torr;

controlling the substrate temperature in the chamber to maintain a predetermined substrate temperature of about 300° C.;

while a sputtering shutter in the chamber is closed, flowing argon (Ar) gas into the chamber at a flow rate of 25 sccm under a first predetermined controlled gas pressure of 20 mTorr and applying a first predetermined DC power of 10 W to backsputter the Al-containing target in the chamber;

while the sputtering shutter in the chamber is still closed, flowing Ar and oxygen ($O_2$) gases into the chamber at a predetermined Ar:$O_2$ flow rate ratio of 4.5:1 under a second controlled gas pressure of 3 mTorr and applying a second predetermined DC power of 200 W to pre-sputter the Al-containing target in the chamber for 5 minutes; and opening the sputtering shutter and sputtering Al from the target onto the substrate while continuing to flow the Ar and $O_2$ gases into the chamber at the predetermined Ar:$O_2$ flow rate ratio of 4.5:1 under the second predetermined gas pressure of 3 mTorr and the second predetermined DC power of 200 W;

wherein the sputtering of the Al and the flowing of the Ar and $O_2$ gases at the predetermined Ar:$O_2$ flow rate ratio of 4.5:1 under the second predetermined gas pressure of 3 mTorr and the second predetermined DC power of 200 W causes an amorphous $Al_2O_3$ film having no crystallinity to be deposited on the substrate at a rate of 0.46 nm/min, the deposited $Al_2O_3$ film being fully stoichiometric and having a predetermined reduced density of TLS.

6. The method for producing a fully amorphous sputtered stoichiometric $Al_2O_3$ thin film according to claim 5, wherein the chamber is evacuated to a base chamber pressure of about $7\times10^{-8}$ Torr.

7. A method for making a superconducting $Al_2O_3$ quantum bit having a reduced density of two-level tunneling states (TLS), comprising:

placing a substrate comprising a first superconducting thin film material into a sputtering chamber having an Al-containing target therein and evacuating the chamber to a predetermined base pressure of no more than $7\times10^{-8}$ Torr;

controlling the substrate temperature in the chamber to maintain a predetermined substrate temperature of about 300° C.;

while a sputtering shutter in the chamber is closed, flowing argon (Ar) gas into the chamber at a flow rate of 25 sccm under a first predetermined controlled gas pressure of 20 mTorr and applying a first predetermined DC power of 10 W to backsputter the Al-containing target in the chamber;

while the sputtering shutter in the chamber is still closed, flowing Ar and oxygen ($O_2$) gases into the chamber at a predetermined Ar:$O_2$ flow rate ratio of 4.5:1 under a second controlled gas pressure of 3 mTorr and applying a second predetermined DC power of 200 W to pre-sputter the Al-containing target in the chamber for 5 minutes; and opening the sputtering shutter and sputtering Al from the target onto the substrate while continuing to flow the Ar and $O_2$ gases into the chamber at the predetermined Ar:$O_2$ flow rate ratio of 4.5:1 under the second predetermined gas pressure of 3 mTorr and the second predetermined DC power of 200 W;

wherein the substrate temperature of 300° C., the sputtering of the Al and the flowing of the Ar and $O_2$ gases at the predetermined Ar:$O_2$ flow rate ratio of 4.5:1 under the second predetermined gas pressure of 3 mTorr and the second predetermined DC power of 200 W causes an amorphous $Al_2O_3$ film having no crystallinity to be deposited on the substrate at a rate of 0.46 nm/min, the deposited $Al_2O_3$ film being fully stoichiometric and having a density of TLS that is reduced by a factor of five; and depositing a second superconducting thin film material on an upper surface of the $Al_2O_3$ film to form a superconducting quantum bit structure.

8. The method according to claim 7, wherein the superconducting quantum bit is a Josephson junction.

* * * * *